United States Patent [19]
Choi

[11] Patent Number: 5,633,201
[45] Date of Patent: May 27, 1997

[54] METHOD FOR FORMING TUNGSTEN PLUGS IN CONTACT HOLES OF A SEMICONDUCTOR DEVICE

[75] Inventor: Kyeong K. Choi, Kyoungki-do, Rep. of Korea

[73] Assignee: Hyundai Electronics Industries, Co., Ltd., Kyoungki-do, Rep. of Korea

[21] Appl. No.: 538,466

[22] Filed: Oct. 3, 1995

Related U.S. Application Data

[63] Continuation-in-part of Ser. No. 422,771, Apr. 14, 1995, abandoned, which is a continuation of Ser. No. 159,236, Nov. 30, 1993, abandoned.

[30] Foreign Application Priority Data

Nov. 30, 1992 [KR] Rep. of Korea .................. 92-22796

[51] Int. Cl.$^6$ .................................................. H01L 21/283
[52] U.S. Cl. ........................ 438/620; 438/675; 438/641
[58] Field of Search .......................... 437/50, 187, 189, 437/190, 192, 194, 195, 228 ST, 946; 257/752, 758, 763

[56] References Cited

U.S. PATENT DOCUMENTS

| | | | |
|---|---|---|---|
| 4,532,702 | 8/1985 | Gigante et al. | 437/192 |
| 4,540,607 | 9/1985 | Tsao | 427/253 |
| 4,552,783 | 11/1985 | Stoll et al. | 427/91 |
| 4,777,061 | 10/1988 | Wu et al. | 437/200 |
| 5,210,053 | 5/1993 | Yamagata | 437/192 |
| 5,260,232 | 11/1993 | Muroyama et al. | 437/187 |

FOREIGN PATENT DOCUMENTS

| | | |
|---|---|---|
| 3-262118 | 11/1991 | Japan . |
| 4-7823 | 1/1992 | Japan . |
| 4-65129 | 3/1992 | Japan . |

(List continued on next page.)

OTHER PUBLICATIONS

Eddy, C. R. et al., *J. Mater. Res.*, vol. 7, No. 12, Dec. 1992, pp. 3255–59.

Choi, S. W., et al., *J. Mater. Res.*, vol. 8, No. 4, Apr. 1993, pp. 847–54.

Gordon et al., "Atmospheric Pressure Chemical . . . ", J. Mater. Res., vol. 6, No. 1, Jan. 1991, pp. 5–7.

Osenbach et al., "Selective Epitaxial Growth . . . ", J. Mater. Res., vol. 6, No. 11, Nov. 1991, pp. 2318–2323.

(List continued on next page.)

*Primary Examiner*—T. N. Quach
*Attorney, Agent, or Firm*—Reid & Priest LLP

[57] ABSTRACT

A method for forming tungsten (or aluminum) plugs in contact holes of an ultra highly integrated semiconductor device is disclosed. The method comprises the steps of: applying an etch process to a first insulating layer covering an active region and a field oxide film of a substrate and to a second insulating layer to form a first deep contact hole on the active region by use of a first photosensitive pattern, said first photosensitive pattern being formed on said second insulating film atop said first insulating film; depositing tungsten (or aluminum) on said active region of said first contact hole by use of a selective metal deposition reactor to form a first tungsten (or aluminum) plug filling said first contact hole completely; treating the upper surface of said first tungsten (or aluminum) plug chemically with a mixture of $BCl_3$, $Cl_2$, and HF in an argon carrier, in a plasma reactor so as not to grow the first tungsten (or aluminum) plug any more; applying another etch process to a second insulating layer to form a second shallow contact hole on a conductive wire by use of a second photosensitive pattern formed on said second insulating film, said conductive wire being formed on said first insulating film atop said oxide film; depositing tungsten (or aluminum) on said active region of said second contact hole by use of said selective metal deposition reactor under the condition stopping the growth of said first tungsten (or aluminum) plug so as to form a second tungsten (or aluminum) plug filling said second contact hole completely.

4 Claims, 4 Drawing Sheets

FOREIGN PATENT DOCUMENTS

| | | |
|---|---|---|
| 4-142062 | 5/1992 | Japan . |
| 4-142061 | 5/1992 | Japan . |
| 4-278526 | 10/1992 | Japan . |
| 4-286325 | 10/1992 | Japan . |
| 4-291746 | 10/1992 | Japan . |
| 4-294531 | 10/1992 | Japan . |
| 4-307933 | 10/1992 | Japan . |
| 4-307934 | 10/1992 | Japan . |
| 4-336422 | 11/1992 | Japan . |
| 5-3171 | 1/1993 | Japan . |

OTHER PUBLICATIONS

Cabrera et al., "Oxidation Protection For . . . ", J. Mater. Res., vol. 6, No. 1, Jan. 1991, pp. 71–79.

Littwood, I. M., "Ion—ion recombination . . . ", J. Phys. D: Appl. Phys., 23, 1990, (month not known), pp. 308–311.

La Via, et al., "Arsenic Redistribution . . . ", Semicond. Sci. Technol. 5(1990), pp. 831–835 (month not known).

Semu et al., "Methane–hydrogen III–V . . . ", Semicond. Sci. Technol. 6(1991), pp. 287–289 (month not known).

Maurel, Ph, et al., "Metal–organic molecular . . . ", Semicond. Sci. Technol. 6(1991), pp. 254–259 (month not known).

5,633,201

1

METHOD FOR FORMING TUNGSTEN PLUGS IN CONTACT HOLES OF A SEMICONDUCTOR DEVICE

This is a continuation-in-part of U.S. patent application Ser. No. 08/422,771, filed Apr. 14, 1995, now abandoned, which is a continuation of application Ser. No. 08/159,236, filed Nov. 30, 1993, now abandoned.

BACKGROUND OF THE INVENTION

1. Field of the Invention

The present invention relates, in general, to a method for forming tungsten plugs in contact holes of a semiconductor device, and more particularly, to reducing contact resistance and maintaining control for the heights of the plugs.

2. Description of the Prior Art

Generally, a method for fabricating a semiconductor device comprises forming a contact hole as a connecting portion on a substrate through an insulating film and burying a suitable metal, for example, tungsten in the contact hole to electrically connect the substrate with a metal layer positioned above the substrate. When such connecting portion is formed, there are generated problems as follows: first, resistance is increased between the plug formed in the contact hole and the metal layer; and second, in the case that the plug is formed by at least 2-step processes in a contact hole having nonuniform depth, the height that the plug, for example, a tungsten plug grows up to cannot be controlled appropriately.

In efforts to solve the aforementioned problems, there have been suggested many methods. For example, Japanese Pat. Laid-Open Publication No. Heisei 3-262118 to Sakamoto, Laid-Open Publication No. Heisei 4-65129 to Tamura, Laid-Open Publication Nos. Heisei 4-142061 and 4-336422 to Hasegawa, Laid-Open Publication No. Heisei 4-7823 to Keoda, Laid-Open Publication No. Heisei 4-291746 to Shinohara, Laid-Open Publication No. Heisei 4-142062 to Nakatani, Laid-Open Publication No. Heisei 4-278526 to Ishihara, Laid-Open Publication No. Heisei 4-286325 to Watanabe, et al, Laid-Open publication No. Heisei 4-294531 to Muroyama, Laid-Open publication No. Heisei 4-307933 to Saito, et al, Laid-Open Publication No. Heisei 4-307934 to Saito and Laid-Open Publication No. Heisei 5-3171 to Miyamoto, and U.S. Pat. No. 5,202,579 to Fujii, et. al., U.S. Pat. Nos. 5,183,782 to Onishi, et. al. and 4,822,753 to Pintchovsky, et. al. have disclosed methods for reducing the contact resistance of tungsten plugs, for improving the wire reliability by the planarization of the upper surface of the tungsten plugs grown, and for improving the step coverage of the metal layer formed uppermost by taping the edge of the contact hole.

However, with regard to the adjustment of the heights of the tungsten plugs when the tungsten plugs are formed by the combination of different steps in the contact holes having nonuniform depths, the methods proposed from the above patents have not been completely successful and the contact resistance cannot be reduced thereby.

Hereinafter, description of the prior art for forming tungsten plugs along with the problems generated therefrom will be given for the better understanding, with reference to FIG. 1A through 1D, wherein are shown process steps for forming tungsten plugs in contact holes with different depths.

Referring initially to FIG. 1A, there is a schematic, cross sectional view illustrating the step of forming a contact hole. For this, a substrate 1 is first sectioned into an active region

2 and a device separation region by a field oxide film 2 and is entirely covered with a first insulating layer 3. Over a predetermined portion of the first insulating film 3 atop the field oxide film 2 is formed a conductive wire 4 and then, over the resulting structure is coated a second insulating layer 5, which is subsequently covered with a first photosensitive pattern 6 for contact mask. Using the first photosensitive pattern 6, an etch process is applied to the first and the second insulating films 3 and 5 to form a first contact hole 7 on the active region of the substrate 1. The dot lines shown in this figure represent the region which is to be provided to form another contact hole.

Referring now to FIG. 1B, there is shown a first tungsten plug 8 of predermined thickness which is buried in the first contact hole 7 after removing the first photosensitive pattern 6 and of which upper part is placed under the surface of the second insulating layer 5. The first tungsten plug 8 formed is so tall as to make the first contact hole 7 have the same or similar depth as a second contact hole, represented by dot lines, to be formed later.

Turning now to FIG. 1C, there is illustrated an etching process which is applied to the second insulating layer 5 exposed after forming a second photosensitive film pattern 9 for contact mask for the purpose of forming a second contact hole 10 exposing the conductive wire 4 therethrough.

Finally, with reference to FIG. 1D, there is a schematic, cross sectional view illustrating the step of connecting with a metal layer. For this, after removing the second photosensitive pattern 9, the resulting first contact hole 7 and the second contact hole 10 are filled with tungsten plugs 11 and then, a metal layer 12 is formed on the entire resulting structure. As a result, the metal layer 12 is connected with the active region of the substrate 1 through the first and the second tungsten plugs and with the conductive wire 4 through the second tungsten plug.

Since the first tungsten plug is deposited on the substrate of the first contact hole at a thickness corresponding to approximately half depth of the contact hole and the second tungsten plug is deposited over the first tungsten plug according to the described conventional method, the thickness of the first tungsten plug should be carefully decided in consideration of second contact hole depth. That is, unless the upper surface of the first tungsten plug 8 reaches the same height with the upper surface of the conductive wire 4, the metal layer 12 is formed badly since the second tungsten plug 11 is uniformly thick. What is worse, the patterning process of the second photosensitive film for contact mask may contaminate the upper surface of the first tungsten plug, to increase the contact resistance between the first tungsten plug and the second tungsten plug in the first contact hole.

SUMMARY OF THE INVENTION

Therefore, an object of the present invention is to solve the aforementioned problems encountered in the prior arts and to provide a method for forming plugs in contact holes of semiconductor device, capable of reducing contact resistance and controlling the height of the tungsten plug accurately.

In accordance with the present invention, the above object can be accomplished by providing a method for forming tungsten (or aluminum) plugs in contact holes, which comprises the steps of: applying an etch process to a first insulating layer covering an active region and a field oxide film of a substrate and to a second insulating layer to form first a deep contact hole on the active region by use of a first photosensitive pattern, said first photosensitive pattern being formed on said second insulating film atop said first insulating film; depositing tungsten (or aluminum) on said active region of said first contact hole by use of a selective metal deposition reactor to form a first tungsten plug filling said first contact hole completely; treating the upper surface of said first tungsten (or aluminum) plug chemically in a plasma reactor so as not to grow the first tungsten (or aluminum) plug any more; applying another etch process to a second insulating layer to form a shallow, first contact hole on a conductive wire by use of a second photosensitive pattern formed on said second insulating film, said conductive wire being formed on said first insulating film atop said oxide film; depositing tungsten (or aluminum) on said active region of said second contact hole by use of said selective metal deposition reactor under the condition of growth stop of said first tungsten (or aluminum) plug so as to form a second tungsten (or aluminum) plug filling said second contact hole completely.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in details a certain illustrative embodiment of the invention, this being indicative, however, of but one of the various ways in which the principles of the invention may be employed.

DETAILED DESCRIPTION OF THE PREFERRED EMBODIMENT

Hereinafter, the preferred embodiment of the present invention is to be in details described with reference to the drawings set forth.

Figure 1A:
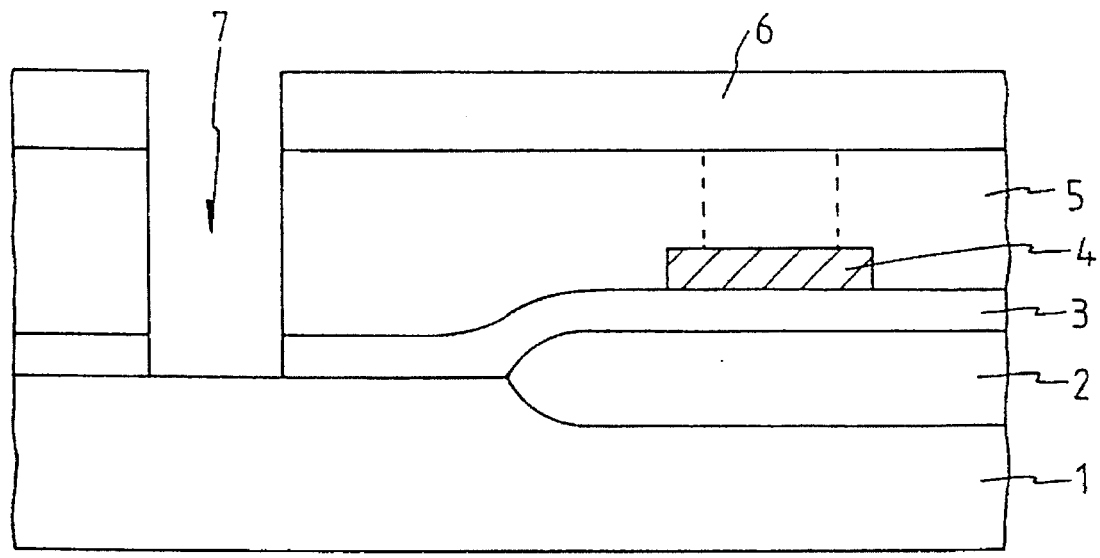
FIG. 1A through 1D are schematic, cross sectional views illustrating a conventional method for forming tungsten plugs in contact holes.
Figure 1B:
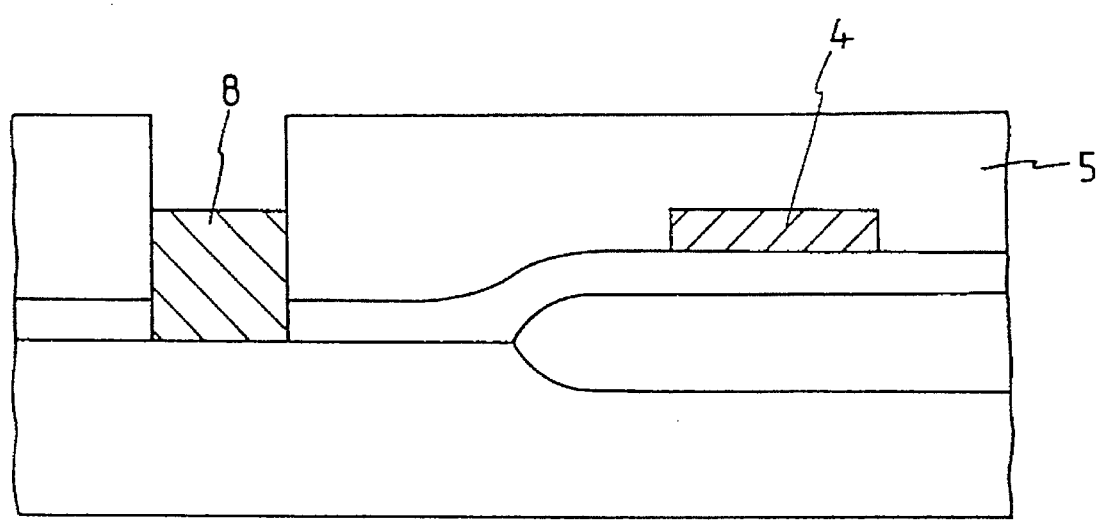
Figure 1C:
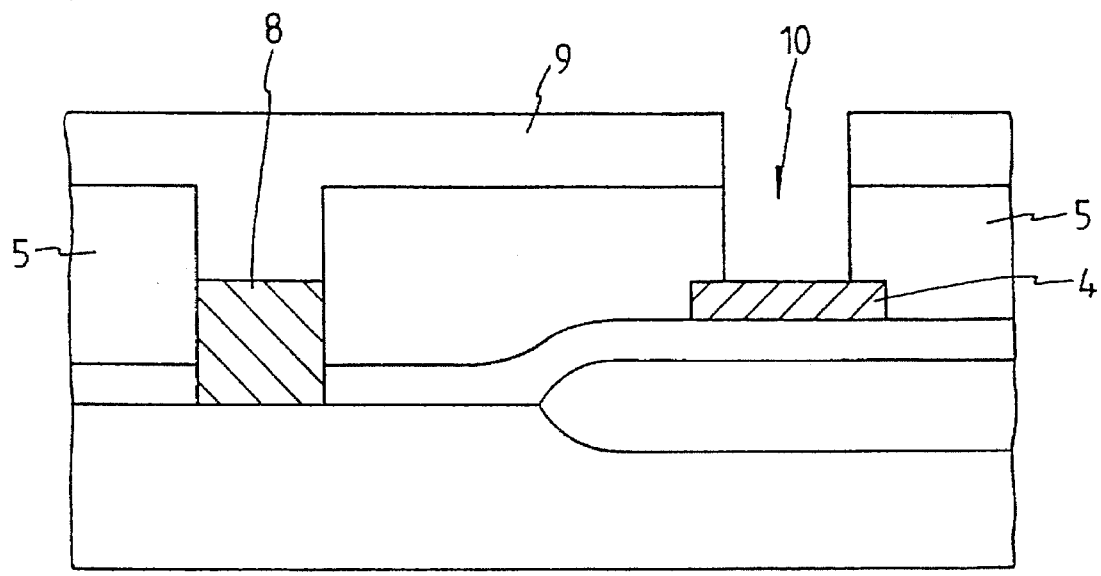
Figure 1D:
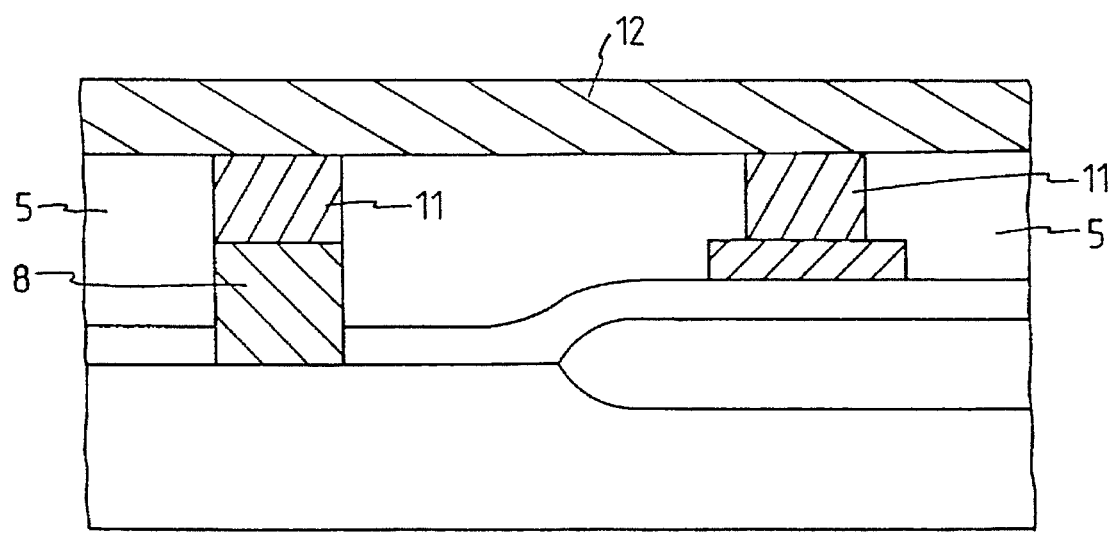
Figure 2A:
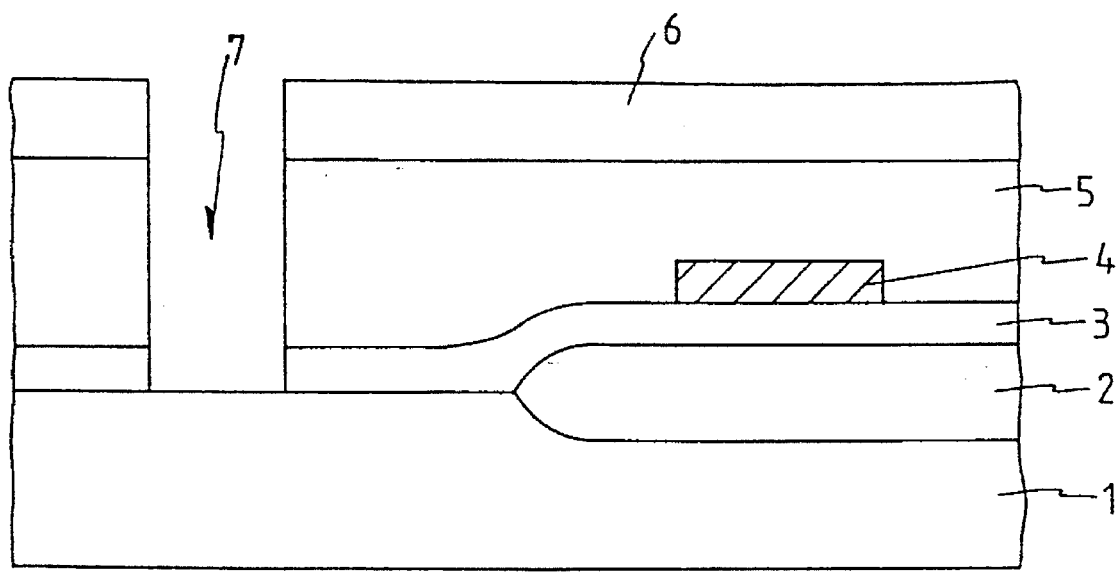
FIG. 2A through 2D are schematic, cross sectional views illustrating a method for forming tungsten plugs in contact holes, according to the present invention.

Referring initially to FIG. 2A, there is a schematic, cross sectional view illustrating the step of forming a contact hole which is the same as 1A. For this, a field oxide film 1, a first insulating layer 3, a conductive wire 4, a second insulating layer 5 and a first photosensitive film pattern 6 are formed on a silicon substrate and then, by an etching process, a contact hole 7 is formed exposing the silicon substrate 1. The substrate 1 is first sectioned into an active region and a device separation region by a field oxide film 2 and is entirely covered with a first insulating layer 3. Over a predetermined portion of the first insulating film 3 atop the field oxide film 2 is formed a conductive wire 4 and then, over the resulting structure is coated a second insulating layer 5, which is subsequently covered with a first photosensitive pattern 6 for contact mask. Using the first photosensitive pattern 6, the first and the second insulating films 3 and 5 are subjected to an etch process so as to form a first contact hole 7 on the active region of the substrate 1.

Figure 2B:
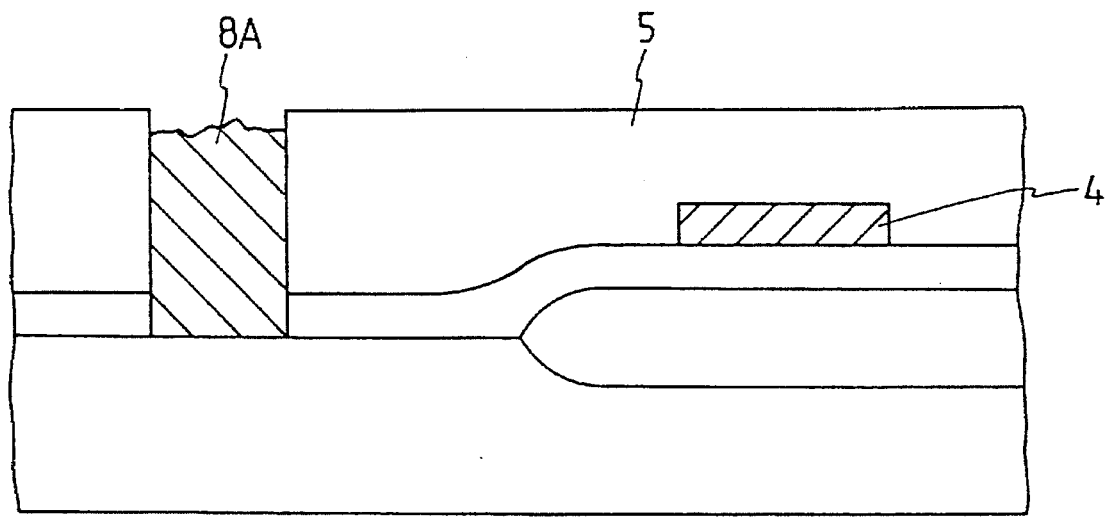

Referring to FIG. 2B, there is shown a first tungsten plug 8A which is buried in the first contact hole 7 by use of a selective metal deposition reactor after removing the first photosensitive pattern 6. In contrast with the above conventional one, the first contact hole is full of the first tungsten plug of which the upper surface is chemically treated with a mixture of $BCl_3$, $Cl_2$ and HF in an argon carrier (hereinafter "$BCl_3/Cl_2/HF/Ar$") for 30 seconds in a plasma reactor. As a result, the first tungsten plug filling the first contact hole is slightly eroded at the upper surface, forming an uneven surface which is positioned below the upper surface of the second insulating layer 5. Treatment of the surface of the first tungsten plug with $BCl_3/Cl_2/HF/Ar$ in a plasma reactor is necessary to prevent growth of the first tungsten plug while the second tungsten plug is being grown. The tungsten plug may instead be formed of a metal capable of being deposited by a selective metal deposition method, for example, aluminum or aluminum alloy. After treatment with $BCl_3/Cl_2/HF/Ar$ is discontinued, the second tungsten plug is then subsequently grown by conventional methods.

Figure 2C:
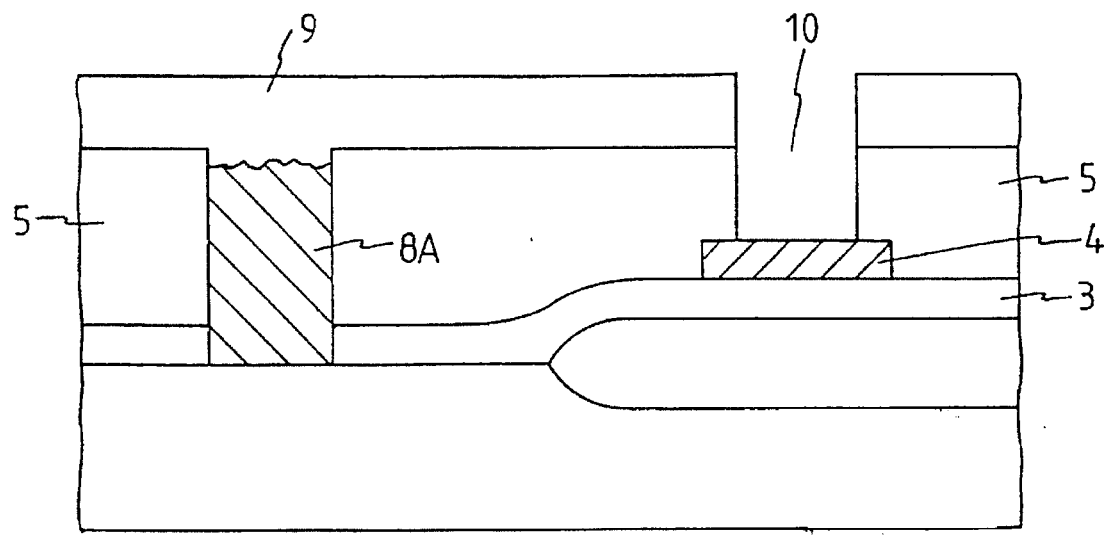

Turning now to FIG. 2C, there is illustrated an etching process which is applied to the second insulating layer 5 covered with a second photosensitive film pattern 9 for contact mask to form a second contact hole 10 exposing the conductive wire 4 therethrough.

Figure 2D:
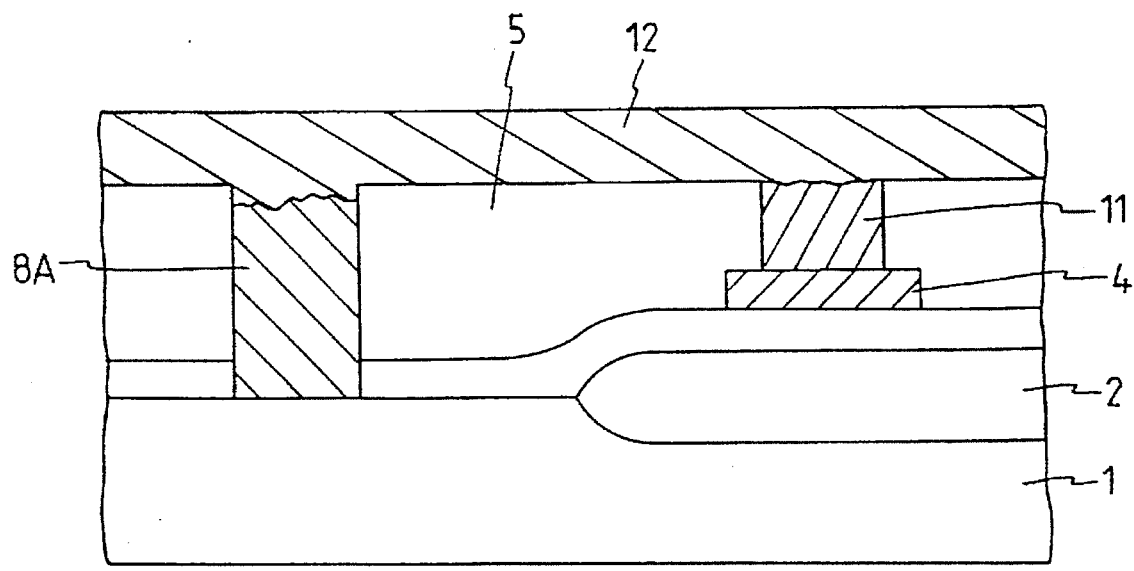

Finally, with reference to FIG. 2D, there is a schematic, cross sectional view illustrating the steps of connecting with a metal layer. For this, after removing the second photosensitive pattern 9, the second contact hole 10 is filled with tungsten plugs 11 by use of the selective metal deposition reactor and then, a metal layer 12 such as an aluminum layer is formed on the upper part of the entire structure. As a result, the metal layer 12 comes into contact respectively with the silicon substrate 1 and the conductive wire 4 through the first tungsten plug 8A and the second tungsten plug 11.

As mentioned above, the chemical treatment does not permit tungsten to grow at the surface of the first tungsten plug 8A while forming the second tungsten plug 11. Accordingly, the height of the first tungsten plug 8A is maintained constant during the formation of the second tungsten plug 11. Such effect according to the present invention is based on the fact that the proper chemical treatment of the upper surface of the first tungsten plug with $BCl_3/Cl_2/HF/Ar$ in a plasma reactor prevents tungsten growth at the upper surface during the formation of the second tungsten plug. Preferred conditions for the plasma treatment with $BCl_3/Cl_2/HF/Ar$ are as follows: temperature 0°–30° C.; flow rate—$BCl_3$ (5–10 sccm), $Cl_2$ (5–10 sccm), HF (5–20 sccm), Ar (100–200 sccm); total pressure 10 mtorr–1.5 torr; rf power 50–500 W; magnetic field 50–80 gauss. However, it is to be understood that the invention is not limited to these preferred conditions.

As illustrated hereinbefore, the present invention method is characterized by maintaining the height of the first tungsten plug constant during the formation of the second tungsten plug by virtue of the plasma chemical treatment of the first tungsten plug, allowing the fabrication processing to proceed faster than the conventional method in which the height of the first tungsten plug is determined in consideration of the growth height of the second tungsten plug. In addition, the height of the tungsten plug buried in all contact holes can be controlled accurately, so that the metal layer is formed uniformly on the uppermost surface of semiconductor device in accordance with the present invention. Furthermore, the plasma chemical treatment according to the present invention prevents the upper surface of the first tungsten plug from being contaminated by impurities that may be generated in a succeeding process and thus minimizing the resistance between the first tungsten plug and the metal layer deposited on it.

Consequently, in accordance with the present invention, an ultra highly intergrated device, superior in the covering state of the metal layer and reducing contact resistance, can be provided.

What is claimed is:

1. A method for fully burying tungsten plugs in contact holes having different depths, wherein said contact holes are in a semiconductor device which is made up of a substrate, a first insulating layer disposed over said substrate, a second insulating layer disposed over said first insulating layer, and a conductive wire atop a field oxide film said conductive wire disposed under said second insulating film, and having a photosensitive film disposed over said second insulating film; said method comprising the steps of:

forming a deep, first contact hole by etching through the photosensitive film, the second insulating layer and the first insulating layer to an active region of the substrate;

depositing tungsten on said active region to form a first contact plug filling said first contact hole completely;

chemically treating the upper surface of said first tungsten plug with a mixture of $BCl_3$, $Cl_2$, and HF in an argon carrier, in a plasma reactor so as to prevent further growth of said first contact plug;

forming a second photosensitive film on said second insulating layer;

forming a second, shallow, contact hole by etching through said second photosensitive film and through said second insulating layer to the conductive wire, wherein said conductive wire is positioned atop a field oxide film;

depositing tungsten under conditions that prevent growth of said first contact plug, to form a second contact plug filling said second contact hole completely.

2. The method of claim 1 wherein the flow rate of gases is controlled as follows: 5–10 sccm $BCl_3$, 5–10 sccm $Cl_2$, 5–20 sccm HF, and 100–200 sccm Ar; and wherein the total pressure is between 10 mtorr and 1.5 torr.

3. A method for fully burying aluminum or aluminum alloy plugs in contact holes having different depths, wherein said contact holes are in a semiconductor device which is made up of a substrate, a first insulating layer disposed over said substrate, a second insulating layer disposed over said first insulating layer, and a conductive wire atop a field oxide film said conductive wire disposed under said second insulating film, and having a photosensitive film disposed over said second insulating film; said method comprising the steps of:

forming a deep, first contact hole by etching through the photosensitive film, a second insulating layer and the first insulating layer to an active region of the substrate;

depositing aluminum or aluminum alloy on said active region to form a first contact plug filling said first contact hole completely;

chemically treating the upper surface of said first aluminum or aluminum alloy plug with a mixture of $BCl_3$, $Cl_2$, and HF in an argon carrier, in a plasma reactor so as to prevent further growth of said first contact plug;

forming a second photosensitive film on said second insulating layer;

forming a second, shallow, contact hole by etching through said second photosensitive film and through said second insulating layer to the conductive wire, wherein said conductive wire is positioned atop a field oxide film;

depositing aluminum or aluminum alloy under conditions that prevent growth of said first contact plug, to form a second contact plug filling said second contact hole completely.

4. The method of claim 3 wherein the flow rate of gases is controlled as follows: 5–10 sccm $BCl_3$, 5–10 sccm $Cl_2$, 5–20 sccm HF, and 100–200 sccm Ar; and wherein the total pressure is between 10 mtorr and 1.5 torr.

* * * * *